(12) United States Patent
Atallah et al.

(10) Patent No.: US 9,625,924 B2
(45) Date of Patent: Apr. 18, 2017

(54) LEAKAGE CURRENT SUPPLY CIRCUIT FOR REDUCING LOW DROP-OUT VOLTAGE REGULATOR HEADROOM

(71) Applicant: QUALCOMM Incorporated, San Diego, CA (US)

(72) Inventors: Francois Ibrahim Atallah, Raleigh, NC (US); Hoan Huu Nguyen, Durham, NC (US); Keith Alan Bowman, Morrisville, NC (US); Yeshwant Nagaraj Kolla, Wake Forest, NC (US); Burt Lee Price, Apex, NC (US); Samantak Gangopadhyay, Atlanta, GA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/860,717

(22) Filed: Sep. 22, 2015

(65) Prior Publication Data

US 2017/0083031 A1 Mar. 23, 2017

(51) Int. Cl.
  *G05F 1/56* (2006.01)
(52) U.S. Cl.
  CPC ...................... *G05F 1/56* (2013.01)
(58) Field of Classification Search
  CPC .......... H02M 3/158; G05F 1/563; G05F 1/10; H03K 5/15; G06F 1/324
  USPC ............... 323/205, 266, 271, 273, 280, 281, 323/282–285; 327/109, 110, 308, 377, 327/534–536; 713/300, 320, 323, 324, 713/500
  See application file for complete search history.

(56) References Cited

U.S. PATENT DOCUMENTS 6,313,695 B1    11/2001 Ooishi et al.
6,979,984 B2    12/2005 Perrier et al.
7,528,590 B2 *  5/2009  Wei ....................... H02M 3/156
                                                        323/282

(Continued)

OTHER PUBLICATIONS

International Search Report and Written Opinion—PCT/US2016/050747—ISA/EPO—Dec. 5, 2016.

(Continued)

*Primary Examiner* — Rajnikant Patel
(74) *Attorney, Agent, or Firm* — Muncy, Geissler, Olds & Lowe, P.C.

(57) ABSTRACT

Systems and methods relate to a low-dropout voltage (LDO) voltage regulator which receives a maximum supply voltage and provides a regulated voltage to a load, where the load may be a processing core of a multi-core processing system. A leakage current supply source includes a leakage current sensor to determine a leakage current demand of the load of the LDO voltage regulator and a leakage current supply circuit to supply the leakage current demand. In this manner, the leakage current supply source provides current assistance to the LDO voltage regulator, such that the LDO voltage regulator can supply only dynamic current. Thus, headroom voltage of the LDO voltage regulator, which is a difference between the maximum supply voltage and the regulated voltage, can be reduced. Reducing the headroom voltage allows greater number of dynamic voltage and frequency scaling states of the load.

25 Claims, 14 Drawing Sheets

(56) References Cited

U.S. PATENT DOCUMENTS

| | | | | |
|---|---|---|---|---|
| 7,852,061 | B2* | 12/2010 | Liu | G05F 3/30 |
| | | | | 323/313 |
| 7,934,036 | B2* | 4/2011 | Conti | G06F 13/24 |
| | | | | 710/261 |
| 8,836,303 | B2* | 9/2014 | Napravnik | G05F 1/56 |
| | | | | 323/274 |
| 2008/0191791 | A1 | 8/2008 | Nomura et al. | |
| 2008/0203983 | A1 | 8/2008 | Lo Lacono et al. | |
| 2011/0161682 | A1 | 6/2011 | Wen et al. | |
| 2013/0169250 | A1 | 7/2013 | Bouwman et al. | |
| 2013/0265020 | A1 | 10/2013 | Krenzke | |
| 2014/0266103 | A1 | 9/2014 | Wang et al. | |
| 2016/0170465 | A1* | 6/2016 | Flynn | G06F 1/3203 |
| | | | | 713/320 |

OTHER PUBLICATIONS

Madhumitha et al., "A Study of Different Oscillator Structures", International Journal of Innovative Research in Science, Engineering and Technology, May 1, 2014 (May 1, 2014), XP055316512, pp. 12724-12734. Retrieved from the Internet: URL:http://www.ijirset.comjupload/2014/may/88AStudyofDifferent.pdf [retrieved on Nov. 4, 2016].

Yingchieh, H., et al., "Leakage Monitoring Technique in Near-Threshold Systems with a Time-Based Bootstrapped Ring Oscillator", Asian Test Symposium, Proceedings, IEEE, Nov. 18, 2013, (Nov. 18, 2013), XP032536917, pp. 91-96. ISSN: 1081-7735, DOI: 10.1109/ATS.2013.25 [retrieved on Dec. 20, 2013].

\* cited by examiner

LEAKAGE CURRENT SUPPLY CIRCUIT FOR REDUCING LOW DROP-OUT VOLTAGE REGULATOR HEADROOM

FIELD OF DISCLOSURE

Disclosed aspects relate to low drop-out (LDO) voltage regulators. More specifically, exemplary aspects relate to reducing headroom voltage of LDO voltage regulators.

BACKGROUND

Low drop-out (LDO) voltage regulators find applications in integrated circuits where voltage regulation is desired. For example, LDO voltage regulators may be used to supply less than the maximum voltage to selected sections or components of an integrated circuit. An example environment where LDO voltage regulators may be deployed, includes multiprocessors or multi-core processing systems comprising two or more processors or processing cores. Each core may be configured for operating frequencies or processing capabilities specific to the core, and so the power characteristics (e.g., power consumption at desired operating frequencies) of the cores may vary. For example, a core which is to be operated at its maximum performance or highest frequency may be provided the maximum voltage supply, whereas the voltage supply can be reduced for a core which is operated at a lower performance/frequency. LDO voltage regulators may be used to supply a voltage (also referred to as a regulated voltage, herein) that is less than the maximum voltage to some cores based on their individual power characteristics.

FIG. 1 illustrates a conventional multi-core processing system 100 comprising two or more cores depicted as cores 102a-m. Power head switches 106a-m can be closed or turned on in order to supply maximum supply voltage (VDD 108) to the respective cores 102a-m, for example, in cases where the respective cores 102a-m are to be operated at their maximum performance/frequency. Where a lower performance/frequency is acceptable for one or more cores, their corresponding power head switches 106a-m are opened or turned off, and LDO voltage regulators 104a-m are used to provide lower, regulated voltages to those cores. Thus, by controlling power head switches 106a-m and LDO voltage regulators 104a-m, lower voltages may be supplied to the cores. In this manner, energy consumption of multi-core processing system 100 can be reduced.

LDO voltage regulators 104a-m are designed to provide high bandwidths to enable fast responses to fast variations in current demands (or "di/dt," as known in the art), while mitigating voltage droops which are detrimental to the performance or speed of corresponding cores 102a-m. In order to support the current demands, LDO voltage regulators 104a-m may be designed with large headroom voltages. However, low headroom voltages are desirable in some situations, which are difficult to achieve in conventional designs of LDO voltage regulators. Related characteristics of conventional LDO voltage regulators are explained with reference to FIG. 2.

FIG. 2 illustrates a detailed view of an example design of any one of LDO voltage regulators 104a-m. Reference voltage Vref 202 is received at one input of operational amplifier 204, whose output is coupled to the gate of p-channel or p-type metal oxide semiconductor (PMOS) transistor 206. The supply voltage VDD 108 (from FIG. 1) supplies input voltage Vin 208 for LDO voltage regulators 104a-m, and output voltage Vout 210 is the regulated voltage that is supplied to the corresponding cores. Output voltage Vout 210 is also fed back at another input of operational amplifier 204. Input voltage Vin 208 and output voltage Vout 210 appear at source and drain terminals of PMOS transistor 206, respectively. Corresponding cores 102a-m for LDO voltage regulators 104a-m are also shown.

The headroom of LDO voltage regulators 104a-m is the difference between input voltage Vin 208 (which, as will be recalled, is the maximum voltage which supports the highest performance/speed of the corresponding cores) and the desired output voltage Vout 210 (which corresponds to the voltage which supports a lower performance/speed of the corresponding cores which are not operated at their maximum performance/operating frequency). It is observed that making the headroom smaller provides more states of dynamic voltage and frequency scaling (DVFS), which leads to better energy optimization of multi-core processing system 100. As seen from above, the headroom, Vin 208 minus Vout 210, represents the drain to source voltage (Vds) of PMOS transistor 206.

Referring now to FIG. 3, plot 300 is shown, where plot 300 is a graphical representation of the variation of load current 312 of any one of cores 102a-m of FIG. 1, as a function of headroom or Vds 310 of its corresponding LDO voltage regulator 104a-m. With reference to FIG. 2, it is seen that a minimum voltage output from operational amplifier 204 corresponds to a maximum gate to source voltage (Vgs) of PMOS transistor 206. Plots 302, 304, 306, and 308 represent variations of load current 312 with headroom or Vds 310 for various values of Vgs (respectively, for Vgs=1V, 0.8V, 0.6V, and 0.4V in the example illustrated). As previously mentioned, it is desirable to achieve high numbers of DVFS states, which may entail reducing the headroom or Vds 310.

Considering PMOS transistor 206, for a particular width of PMOS transistor 206 and a particular value of Vgs (e.g., any one of plots 302-308), PMOS transistor 206 may supply the desired load current 312 of the corresponding core when Vds 310 is greater than a minimum value. As the width of PMOS transistor 206 increases, this minimum value of Vds 310 decreases. However constraints such as available area and bandwidth of LDO voltage regulators 102a-m, may impose restrictions on increasing the widths of corresponding PMOS transistors 206.

Given the limited sizes and widths of PMOS transistor 206 in conventional LDO voltage regulators 104a-m, reducing Vds 310 puts PMOS transistor 206 deeper in the active region of PMOS transistor 206 (e.g., corresponding to values of Vds 310 falling between voltage 314 and voltage 316 in FIG. 3). For these low values of Vds 310 between voltages 314 and 316, the corresponding load current 312 (indicated by currents 315 and 317, respectively) passing through PMOS transistor 206 is very sensitive to supply noise, due to the steeper slope of the load current 312 versus Vds 310 in these regions. Further, such low values of load current 312 may not satisfy the current demands of the corresponding cores. Thus, lowering Vds 310 to voltages 314-316 can lead to a voltage supply droop, which is detrimental to performance of the corresponding core. Hence, it may not be possible to lower the headroom voltage or Vds 310 to desired levels in conventional LDO voltage regulators 104a-m.

Accordingly, the headroom voltages or values of Vds 310 for conventional LDO voltage regulators 104a-m tend to be higher than desired. In other words, it may be difficult to increase Vout 210 to be closer than a certain amount to Vin 208, referring back to FIG. 2. This means that in conventional implementations, cores 102a-m which can be operated at an intermediate voltage value (wherein the intermediate voltage value falls between Vin 208 and the maximum value of Vout 210 that is possible), will end up being operated at the maximum voltage Vin 208 (e.g., by turning on corresponding power head switches 106a-m and avoiding the use of LDO voltage regulators 104a-m). Accordingly, one or more cores 102a-m may end up being operated at a higher voltage value (maximum voltage Vin 208) even though it may be possible to operate these one or more cores 102a-m at a lower voltage (the intermediate voltage value), due to restrictions on how much the headroom voltages Vds 310 of their corresponding LDO voltage regulators 104a-m can be lowered. Thus, power and energy consumptions of these one or more cores 102a-m may also be seen to correspondingly increase.

As seen from the above discussion, lower headroom voltages are desirable but may not be possible to achieve in conventional LDO voltage regulators.

SUMMARY

Exemplary aspects pertain to systems and methods for reducing headroom voltage of a low-dropout voltage (LDO) voltage regulator. The LDO voltage regulator receives a maximum supply voltage and provides a regulated voltage to a load, where the load may be a processing core of a multi-core processing system. A leakage current supply source includes a leakage current sensor to determine a leakage current demand of the load of the LDO voltage regulator and a leakage current supply circuit to supply the leakage current demand. In this manner, the leakage current source provides current assistance to the LDO voltage regulator, such that the LDO voltage regulator can be designed to supply only dynamic current. Thus, headroom voltage of the LDO voltage regulator, which is a difference between the maximum supply voltage and the regulated voltage, can be reduced. Reducing the headroom voltage allows greater number of dynamic frequency and voltage states of the load.

For example, an exemplary aspect relates to a method of operating a low-dropout voltage (LDO) voltage regulator, the method comprising: determining a leakage current demand of a load of the LDO voltage regulator, and supplying leakage current from a leakage current supply source to meet the leakage current demand of the load of the LDO voltage regulator.

Another exemplary aspect relates to an apparatus comprising a leakage current supply source comprising a leakage current sensor configured to determine a leakage current demand of a load of a low-dropout voltage (LDO) voltage regulator, and a leakage current supply circuit configured to supply leakage current to meet the leakage current demand of the load of the LDO voltage regulator.

Yet another exemplary aspect relates to a system comprising means for determining a leakage current demand of a load of a means for regulating voltage, and means for supplying leakage current to meet the leakage current demand of the load.

BRIEF DESCRIPTION OF THE DRAWINGS

The accompanying drawings are presented to aid in the description of aspects of the invention and are provided solely for illustration of the aspects and not limitation thereof.

DETAILED DESCRIPTION

Figure 1:
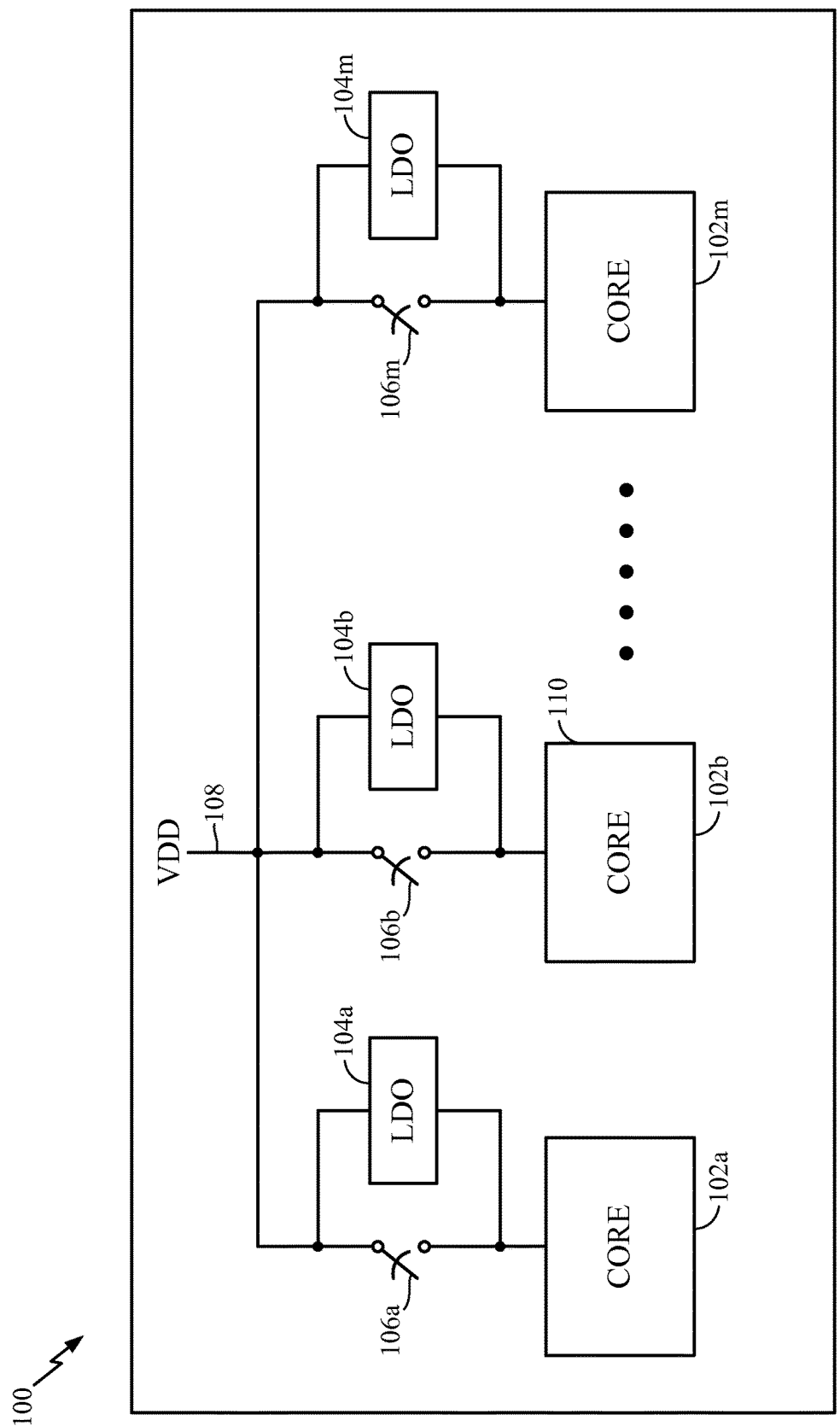
FIG. 1 illustrates a conventional multi-core processing system comprising two or more cores and corresponding LDO voltage regulators.

Aspects of the invention are disclosed in the following description and related drawings directed to specific aspects of the invention. Alternate aspects may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any aspect described herein as "exemplary" is not necessarily to be construed as preferred or advantageous over other aspects. Likewise, the term "aspects of the invention" does not require that all aspects of the invention include the discussed feature, advantage or mode of operation.

The terminology used herein is for the purpose of describing particular aspects only and is not intended to be limiting of aspects of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the aspects described herein, the corresponding form of any such aspects may be described herein as, for example, "logic configured to" perform the described action.

As discussed previously, LDO voltage regulators are circuits which are designed to receive an input voltage such as a maximum supply voltage and provide a lower, regulated voltage to a load (e.g., a processing core of a multi-core processing system). LDO voltage regulators have high bandwidths in order to enable fast responses in supplying currents, for example, to the processing cores, where there may be high di/dt or fast variations in current demand. While headroom voltages of the LDO voltage regulators can be increased in conventional implementations to accommodate the high di/dt values in addition to baseline leakage current demands, exemplary aspects are configured to avoid increasing the headroom voltages in this fashion. Instead, current assistance circuitry is introduced to provide leakage current to the load (e.g., cores) of the LDO voltage regulators. This alleviates the burden on the LDO voltage regulators to supply the total load current, and therefore, the LDO voltage regulators can be designed to supply only the fast changing (high di/dt) dynamic current (which the LDO voltage regulators are already designed to do). More specifically, leakage current supply sources (which may be digitally controlled) are provided to supply the leakage current while the LDO voltage regulators (which may be analog circuits) supply the dynamic current. This allows for lower headroom voltages in exemplary LDO voltage regulators.

It will be understood that the references to processing cores of a multi-core processing system is merely by way of example, and not to be construed as a limitation. As such, the techniques to lower headroom voltages of LDO voltage regulators can be applied to any system where an LDO voltage regulator is used to regulate voltage to any load circuit or subsystem. For example, some integrated circuits may have different voltage islands, where a voltage island can include a subsystem that can operate on a lower voltage than surrounding components. Such subsystems may comprise loads of LDO voltage regulators which are used to provide the desired voltage to the voltage islands. Keeping the various scenarios pertaining to exemplary aspects in mind, the following description will focus on LDO voltage regulators configured to provide regulated voltage to a generic load.

Figure 4A:
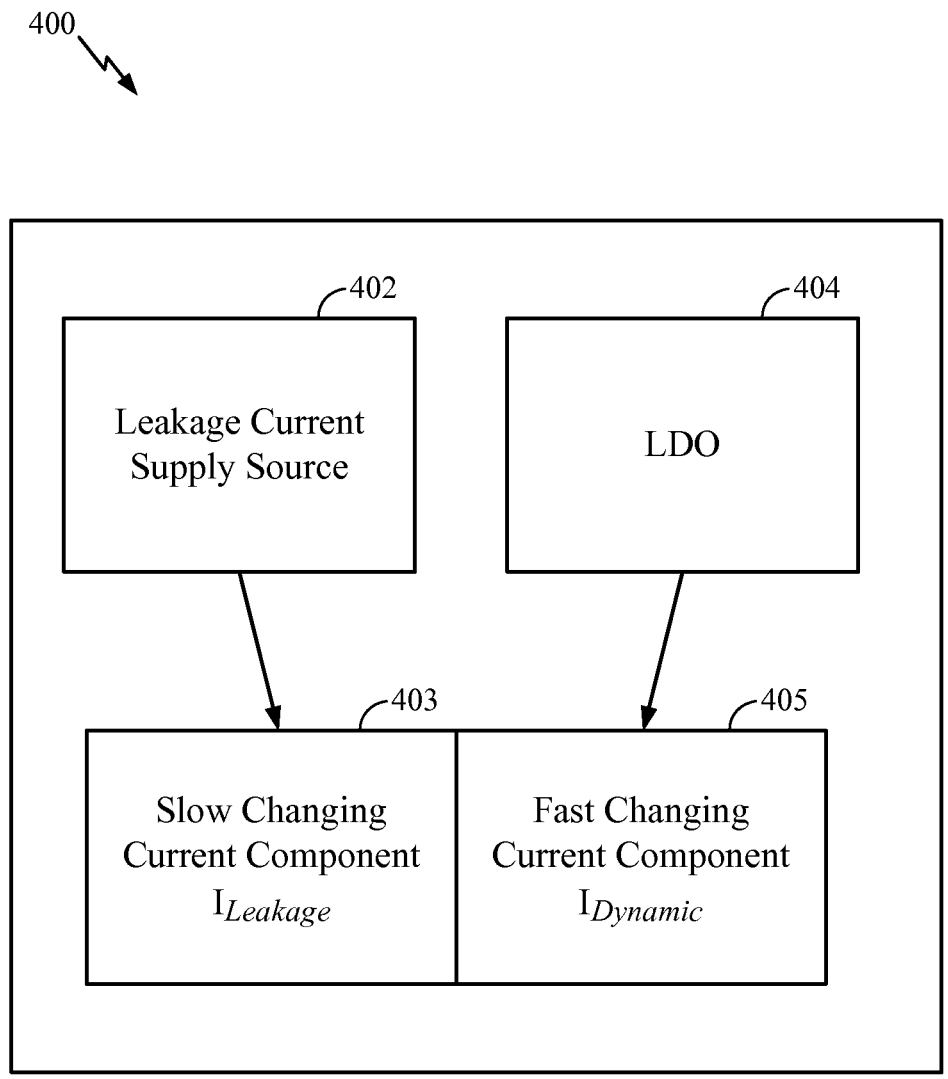
FIG. 4A illustrates a high-level block diagram of an exemplary leakage current supply source to provide current assistance to an LDO voltage regulator.

With reference to FIG. 4A, a high level diagram of exemplary aspects of system 400 are illustrated. System 400 may be a multi-core processing system similar to multi-core processing system 100 of FIG. 1, with several processing cores (not shown in this view). For each processing core in system 400, leakage current supply source 402 is provided to supply slow changing current or leakage current 403, while the LDO voltage regulator 404 is configured, as previously (e.g., similar to FIG. 1), to provide fast changing current or dynamic current 405. The total current demand or load current (e.g., of a processing core coupled to LDO voltage regulator 404) is the sum of leakage current 403 and dynamic current 405. LDO voltage regulator 404 can maintain sufficient headroom to only supply dynamic current 405, which is lower than headroom voltages at which total current demand may be supplied. Therefore, the headroom of exemplary LDO voltage regulator 404 can be reduced, while the total current demand of the processing core is satisfied.

In some aspects, leakage current supply source 402 can be configured by reusing existing unused power head switches (such as conventional power head switches 106a-m of FIG. 1, when corresponding processing core 102a-m is being supplied with current through respective LDO voltage regulator 104a-m) to handle slow current changes of the processing core or any other load.

In some aspects, leakage current supply source 402 is configured by taking into account the slow changing nature of the leakage current 403. Leakage current 403 is a slow changing current because it depends only on the parameters: temperature, voltage, and process variations. The nature of these parameters is briefly explained as follows. With regard to temperature, temperature changes on a die cannot be easily controlled since they are based on ambient temperature and the amount of activity of components integrated on the die. However, temperature changes are slow in relation to the speed at which integrated circuits operate, allowing the integrated circuits with sufficient time to adapt to the temperature variations. Considering voltage now, voltage changes are more controllable, but the time taken to reach a new voltage set point is also largely in relation to the speed of the integrated circuits. Lastly, process variations that can affect leakage current are virtually static within a die, because the processes can at best vary from die to die, or more likely, from wafer to wafer, or lot to lot. Thus, leakage current variation based on parameters such as temperature, voltage, and process variations is relatively slow. Exemplary implementations of leakage current supply source 402 take advantage of the slow changing nature of leakage current, as will be explained in the following sections of this disclosure.

Figure 4B:
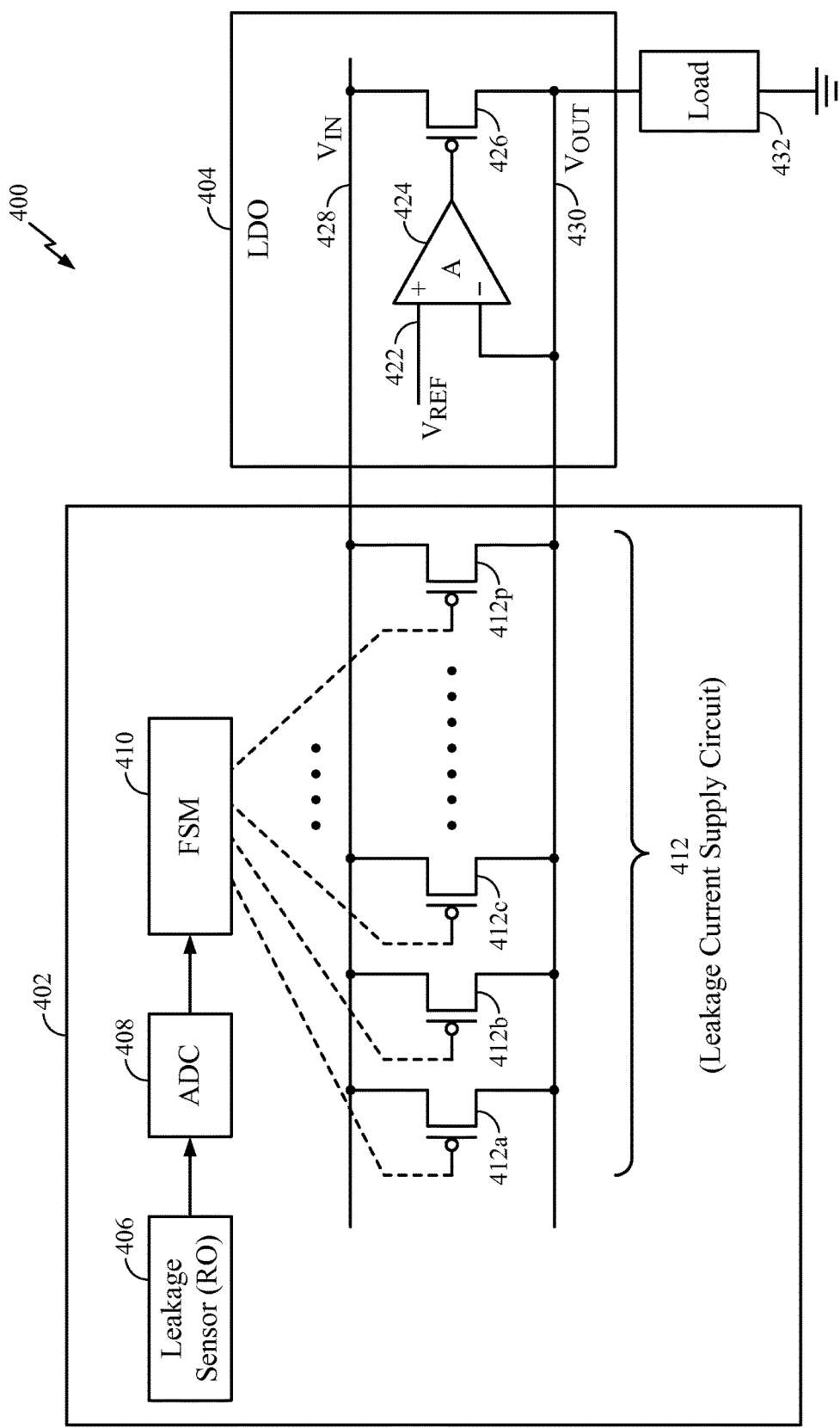
FIG. 4B illustrates a detailed view of the leakage current supply source and LDO voltage regulator of FIG. 4A.

With reference now to FIG. 4B, a more detailed block diagram of leakage current supply source 402 and LDO voltage regulator 404 of system 400 is illustrated. Leakage current supply source 402 includes leakage current sensor 406, analog to digital converter (ADC) 408, finite state machine (FSM) 410, and leakage current supply circuit 412 comprising one or more PMOS transistors 412a-p. Leakage current sensor 406 is configured to sense a leakage current (an analog value) that is based on the above-described parameters for a semiconductor die on which system 400 is integrated, also referred to as the corresponding process, voltage and temperature (PVT) corner on the die. ADC 408 is configured to digitize the sensed leakage current. For example, ADC 408 may output a particular a binary value or digital code which is the digital encoding of the sensed leakage current.

FSM 410 can include any logic, for example, a state machine, which can be used to determine a number of PMOS transistors corresponding to the digital code, which will, in combination, be able to supply the desired sensed leakage current. Thus, FSM 410 can be used to selectively turn on the corresponding number of PMOS transistors 412a-p in leakage current supply circuit 412, based on the digital code supplied by ADC 408, corresponding to the sensed leakage current by leakage current sensor 406. In exemplary aspects, leakage current supply source 402 can be calibrated for particular parameters and maximum supply voltage values (e.g., using a look-up table). Once calibrated, leakage current sensor 406 can track changes in temperature and voltage to output sensed leakage current based on these tracked changes. Correspondingly, the digital code output by ADC 408 can be modified and FSM 410 can be used to turn on or off one or more additional PMOS transistors 412a-p of leakage current supply circuit 412, based on whether there has been an increase or decrease, respectively, in the sensed leakage current. For example, the number of PMOS transistors 412a-p to be switched on can be generally higher for higher values of the digital code received from ADC 408 and lower for lower values of the digital code. Accordingly, FSM 410 can be generally configured to indicate increasing or decreasing the number of PMOS transistors 412*a-p* based on correspondingly, higher or lower values of the digital code. In this manner, leakage current supplied by leakage current supply source 402 can be adjusted based on temperature changes.

Figure 2:
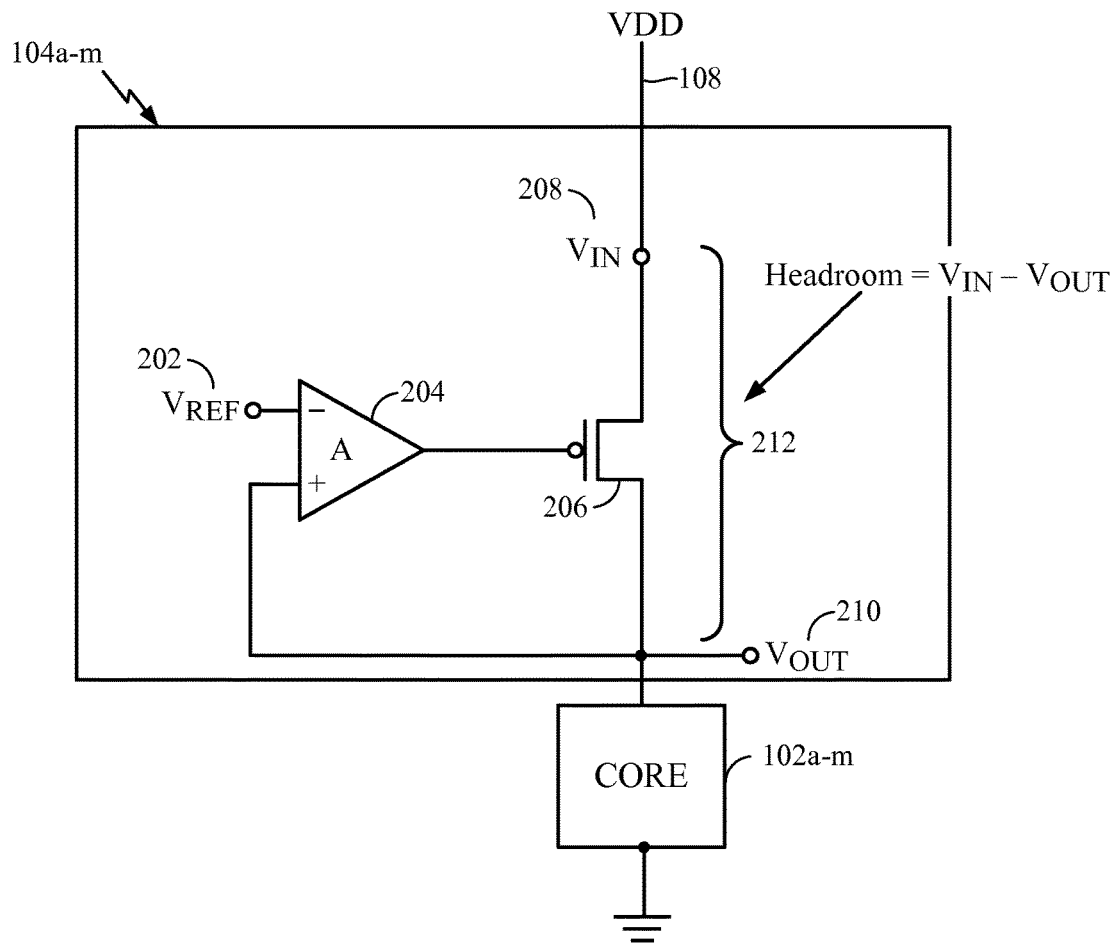
FIG. 2 illustrates a conventional LDO voltage regulator.
Figure 3:
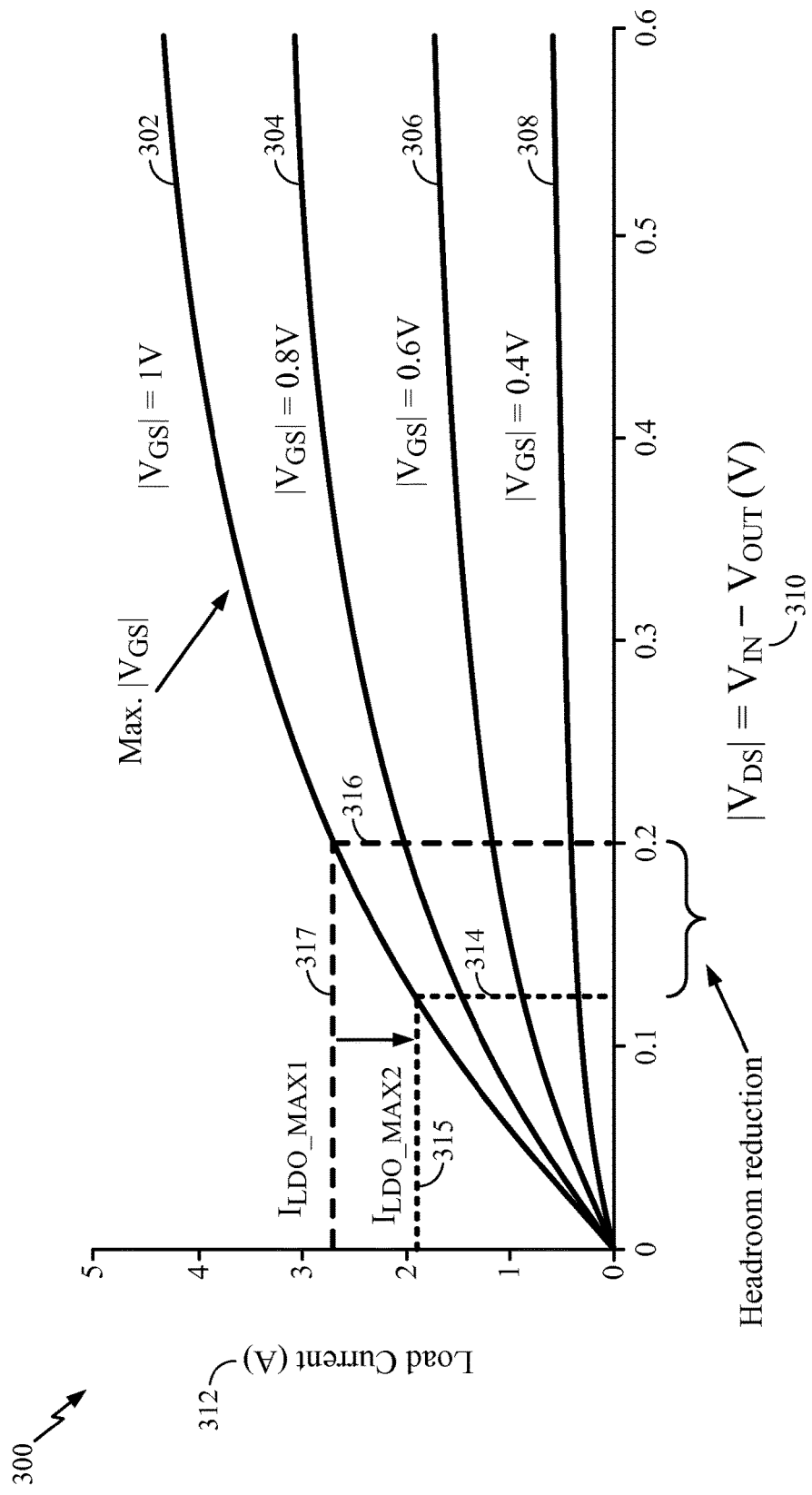
FIG. 3 illustrates a plot of load current versus headroom voltage for a conventional LDO voltage regulator.

LDO voltage regulator 404 is configured similarly to conventional LDO voltage regulators 104*a-m* discussed with reference to FIGS. 1-2. Without an exhaustive repetition of the description of similar features of LDO voltage regulators 104*a-m*, LDO voltage regulator 404 accepts input voltage Vin 428 (which may be the positive or maximum supply voltage such as VDD 108 of FIG. 1) and provides output voltage Vout 430, which is a regulated voltage that is lower than the input voltage Vin 428, to its load 432. Load 432 may be a processing core (e.g., any of cores 102*a-m*) in some aspects. LDO voltage regulator 404 is also supplied with reference voltage Vref 422, which is one input to operational amplifier 424 while another input to operational amplifier 424 is the output voltage 430 provided through a feedback path. The output of operational amplifier 424 drives the gate of PMOS transistor 426 and the headroom voltage of LDO voltage regulator 404, i.e., Vin 428 minus Vout 430, corresponds to the drain to source voltage (Vds) of PMOS transistor 426. As previously described, in contrast to conventional LDO voltage regulators 104*a-m*, the current supplied to load 432 is not entirely provided by LDO voltage regulator 404. Instead, LDO voltage regulator 404 may provide only the fast changing dynamic current to load 432, while slow changing leakage current is supplied by leakage current supply source 402 (where the amount or magnitude of the leakage current supplied is based on the leakage current demand of the corresponding load 432 or processing core and is proportional to the number of PMOS transistors 412*a-p* which are switched on in leakage current supply circuit 412). Accordingly, in contrast to conventional LDO voltage regulators 104*a-m*, headroom voltage of exemplary LDO voltage regulator 404 can be advantageously reduced, allowing for higher number of DVFS states.

With reference now to FIGS. 5A-E, several example implementations of leakage current sensor 406 are illustrated. In general, leakage current sensor 406 is designed to track changes across a wide range of temperature and process corners to accurately sense the leakage current variations with variations in temperature and process corners. Leakage current variations based on voltage may be obtained from look-up tables (not specifically shown), as previously stated. For example, once leakage current has been adjusted based on temperature and process corners, leakage current sensor 406 can be calibrated (e.g., based on the look-up tables) to adjust the sensed leakage current based on variations in Vin 428 and Vout 430, for example. Thus, in some aspects, leakage current demands of load 432 (e.g., a processing core such as cores 102*a-m*), can be accurately supplied by leakage current supply source 402, to meet particular headroom voltages (i.e., Vin 428 minus Vout 430) desired from corresponding LDO voltage regulator 404. Accordingly, in some aspects, leakage current sensed by leakage current sensor 406 can be processed by FSM 410 in order to determine a corresponding number of PMOS transistors 412*a-p* to be turned on in leakage current supply circuit 412.

Figure 5A:
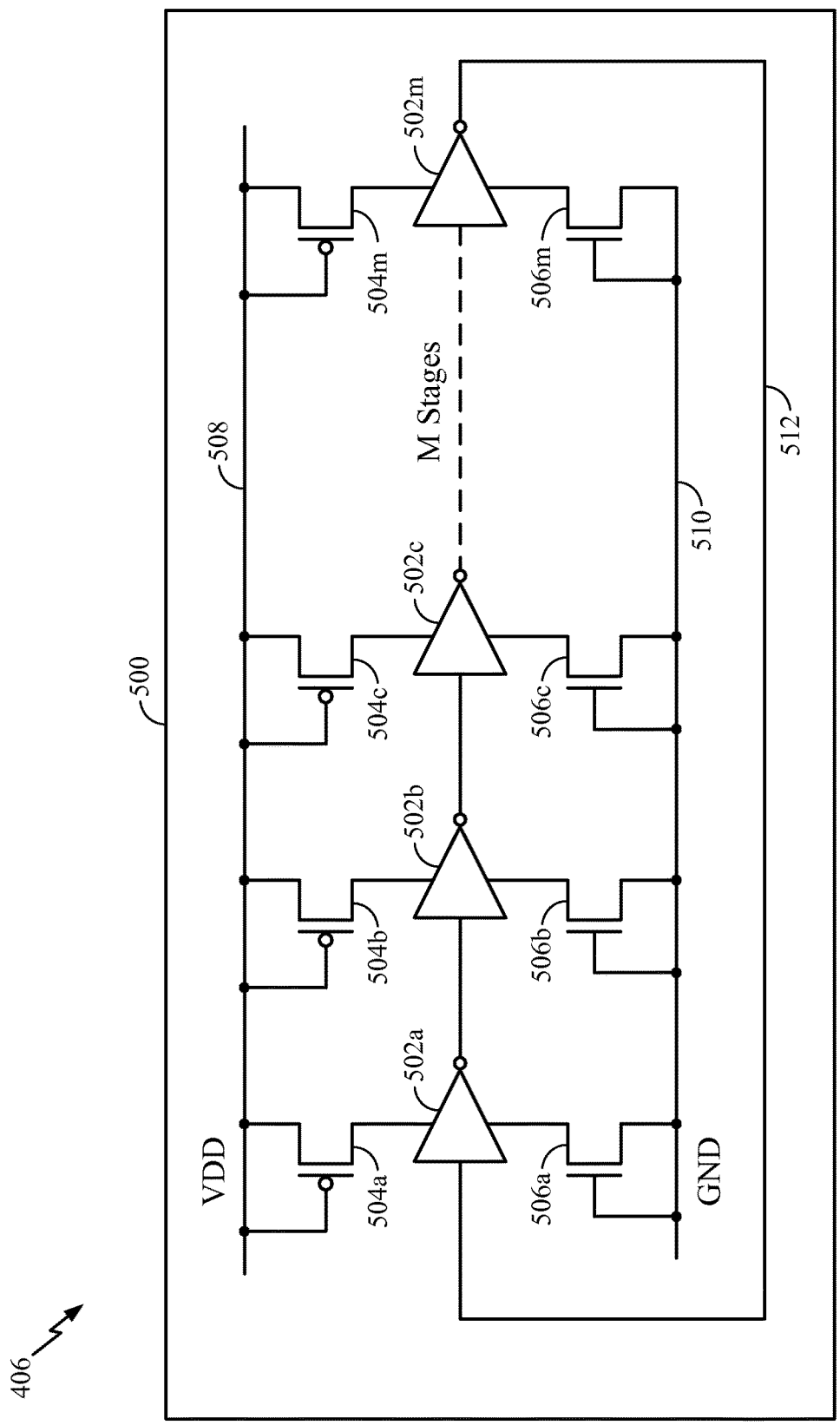
FIGS. 5A-E illustrate example implementations of a leakage current sensor.

Referring now to FIG. 5A, a first implementation of leakage current sensor 406 is shown. Leakage current sensor 406 of FIG. 5A comprises ring oscillator 500 including an odd number of (e.g., three or more) inverters 502*a-m*, connected in a ring, with the output of inverter 502*m*, for example, connected through feedback path 512 to the input of inverter 502*a*. Inverters 502*a-m* are current-starved, where the current passing through them is constrained. For example, inverters 502*a-m* are current-starved based on head switches, foot switches, or a combination thereof. As shown, current passing inverters 502*a-m* is constrained by corresponding PMOS transistor or p-channel field effect transistors (PFETs) 504*a-m* (which couple positive supply voltage VDD 508 to respective inverters 502*a-m*) and corresponding NMOS transistor or n-channel field effect transistors (NFETs) 506*a-m* (which couple respective inverters 502*a-m* to ground 510). Thus, PFETs 504*a-m* are configured as head switches which are turned off (by tying their gate terminals to their source terminals) and the only current passing through them is leakage current. Similarly, NFETs 506*a-m* are configured as foot switches which are also turned off (by tying their gate terminals to their source terminals) and the only current passing through them is leakage current. Accordingly, only leakage current is allowed to pass through corresponding inverters 502*a-m*, causing them to be current-starved.

Considering a first current starved inverter, e.g., inverter 502*a*, for example, when the input of inverter 502*a* switches to "1", the output of the inverter 502*a*, will be discharged by the leakage current of a corresponding first NFET, i.e., NFET 506*a*. On the other hand, when the input of inverter 502*a* is "0," the output of inverter 502*a* will be charged by the leakage current of a corresponding first PFET, i.e., PFET 504*a*. Thus, it is seen that the slew rate of the output of inverter 502*a* (i.e., rate at which the output of inverter 502*a* rises or falls) is controlled by the leakage currents of PFET 504*a* and NFET 506*a*. Similarly, the slew rate of the output of each of the inverters 502*a-m* is controlled by leakage currents of corresponding PFETs 504*a-m* and NFETs 506*a-m*. Therefore, the frequency at which ring oscillator 500 switches or oscillates is dependent on the leakage currents passing through the inverters 502*a-m*. As the leakage current increases due to a temperature increase, for example, the frequency of ring oscillator 500 increases. If the particular process corner pertaining to system 400, for example, is such that the leakage currents are small, then the frequency of ring oscillator 500 will be slower, while if the process corner is such that the leakage current is large, then the frequency of ring oscillator 500 will be higher. Accordingly, the frequency of ring oscillator 500 is seen to vary based on the leakage current. More specifically, the frequency of ring oscillator 500 is seen to be proportional to the leakage current.

Figure 6:
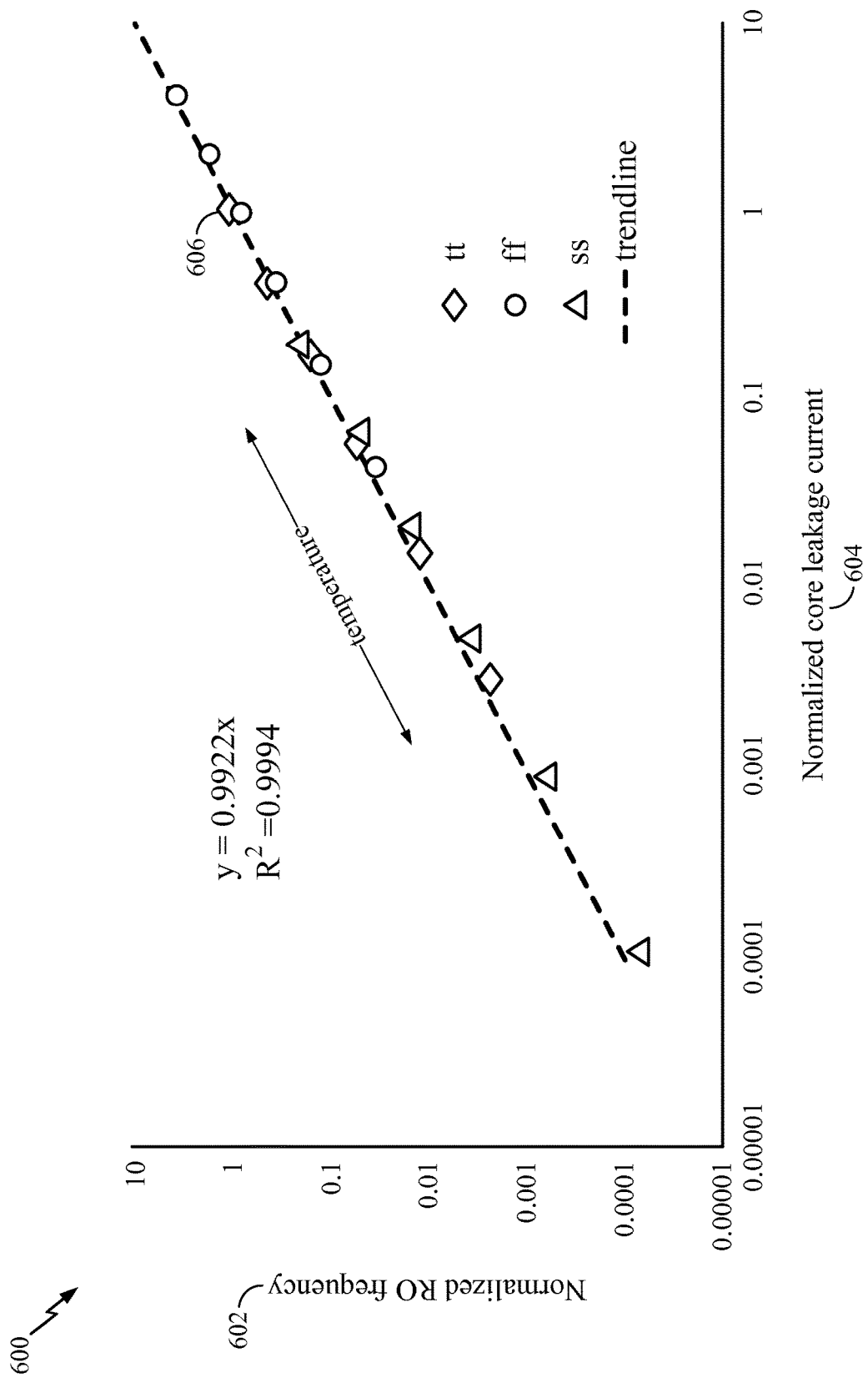
FIG. 6 illustrates a plot of frequency of a ring oscillator used to implement a leakage current sensor according to any of FIGS. 5A-E and corresponding leakage current.

Referring to FIG. 6, graph 600 comprising a plot of normalized ring oscillator (RO) frequency 602 of an example ring oscillator (e.g., ring oscillator 500 of FIG. 5A) versus normalized core leakage current 604 is shown. Graph 600 includes sample points for process corners such as slow-slow (ss), fast-fast (if), and typical-typical (tt), plotted for different temperatures, based for example, on simulation models. A processor core can be modeled with a large number of p-channel and n-channel devices (e.g., p-channel field effect transistor or "PFET" and n-channel field effect transistor or "NFET") connected to positive or maximum power supply (e.g., Vdd 108) and ground voltage, and core leakage current can be obtained for this model comprising PFETs and NFETs. The core leakage current can then be normalized relative to the typical-typical (tt) corner particularly identified by the reference numeral 606, for example, where temperature is 110° C. The normalized value of core leakage current is plotted on the x-axis as normalized core leakage current 604. On the y-axis, the frequency of leakage current sensor 406 is plotted for the various process corners at different temperatures. Corresponding to tt corner 606 where normalized core leakage current 604 is 1, normalized RO frequency 602 is also 1 at 110° C. As seen from graph 600, normalized RO frequency 602 varies in a substantially linear relationship with variations in normalized core leakage current 604 for different process corners sampled at varying temperatures.

Returning to FIG. 5A, leakage current sensor 406 is configured to use a model such as graph 600 of FIG. 6 (e.g., a substantially linear relationship between RO frequency and leakage current) and sense leakage current by measuring the frequency of ring oscillator 500. FIGS. 5B-E illustrate alternative implementations of leakage current sensor 406, which are similarly configured to sense leakage current. These alternative implementations will now be briefly explained in the following sections.

Figure 5B:
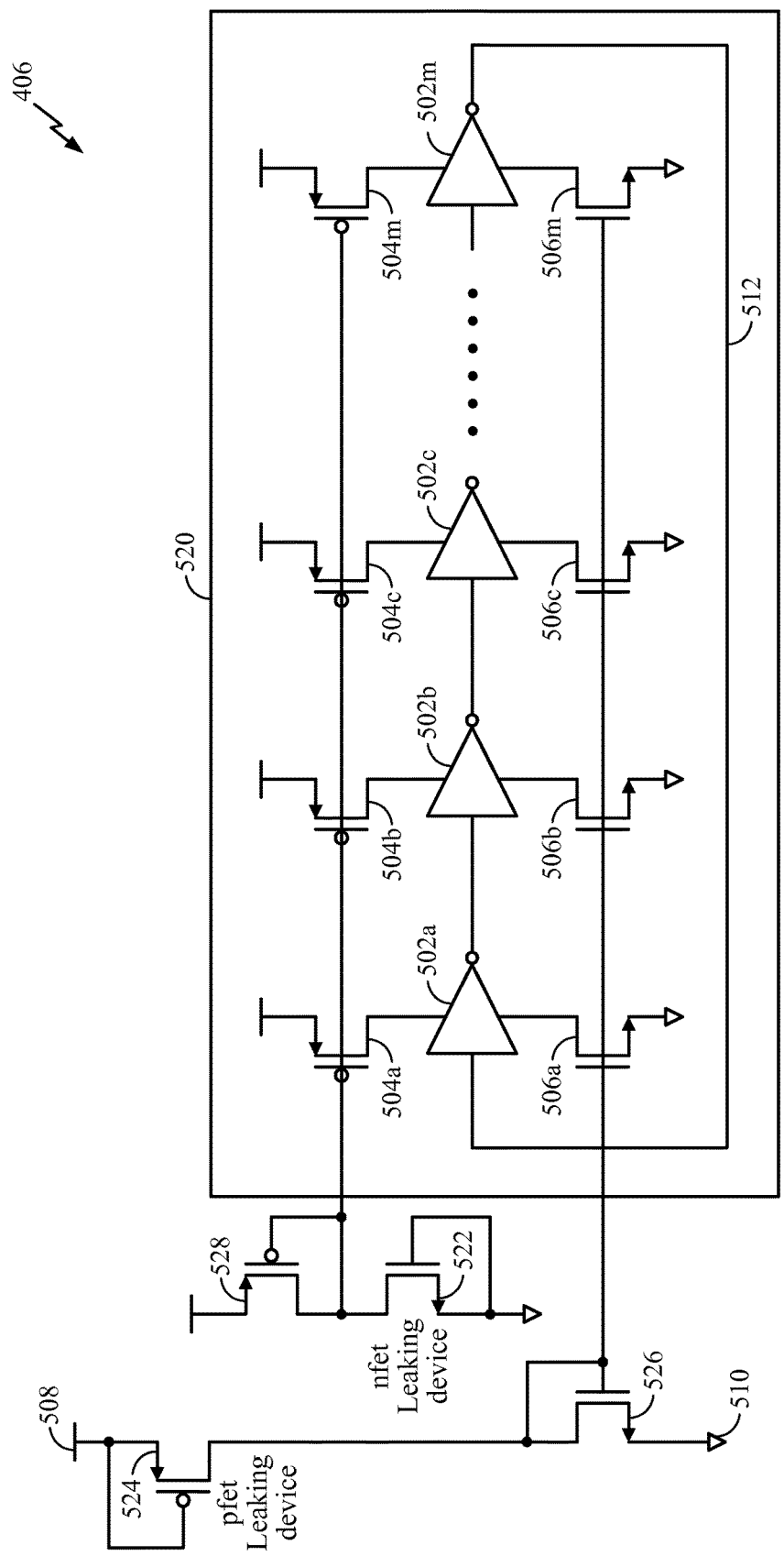

In FIG. 5B, a second implementation of leakage current sensor 406 is shown, comprising ring oscillator 520. In ring oscillator 520, three or more inverters 502a-m are connected in a ring fashion with feedback path 512 as in ring oscillator 500.

However, corresponding head switches formed by PFETs 504a-m and foot switches formed by NFETs 506a-m are not turned off in ring oscillator 520. Rather, PFETs 504a-m and NFETs 506a-m of FIG. 5B, which are smaller in size than corresponding PFETs 504a-m and NFETs 506a-m of FIG. 5A, are caused to supply leakage current to inverters 502a-m based on additional circuitry (the additional circuitry may be used to compensate for the smaller size of PFETs 504a-m and NFETs 506a-m in FIG. 5B). The additional circuitry includes, for example, a first bias circuit comprising PFET 528 (with its gate connected to its drain terminal) and NFET leaking device 522 (which has its gate connected to its source terminal) connected to PFETs 504a-m, in order to bias gate voltages of PFETs 504a-m such that leakage current flows through PFETs 504a-m. Similarly, the additional circuitry also includes a second bias circuit comprising PFET leaking device 524 (with its gate connected to its source terminal) and NFET leaking device 526 (with its gate connected to its drain terminal) connected to NFETs 506a-m, in order to bias gate voltages of NFETs 506a-m such that leakage current flows through NFETs 506a-m. The first and second bias circuits may be used for additional control of the leakage currents passed through inverters 502a-m.

Figure 5C:
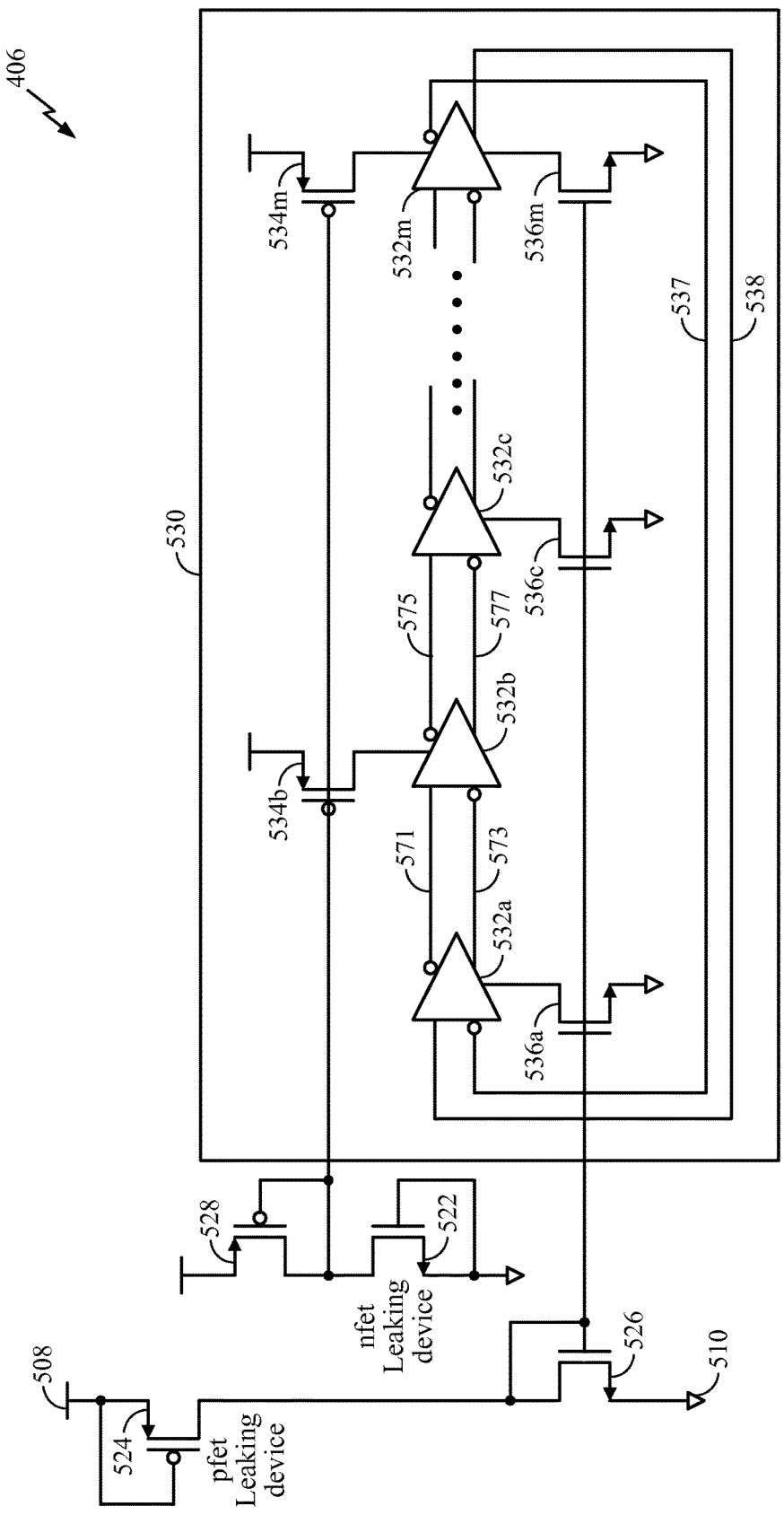
Figure 5D:
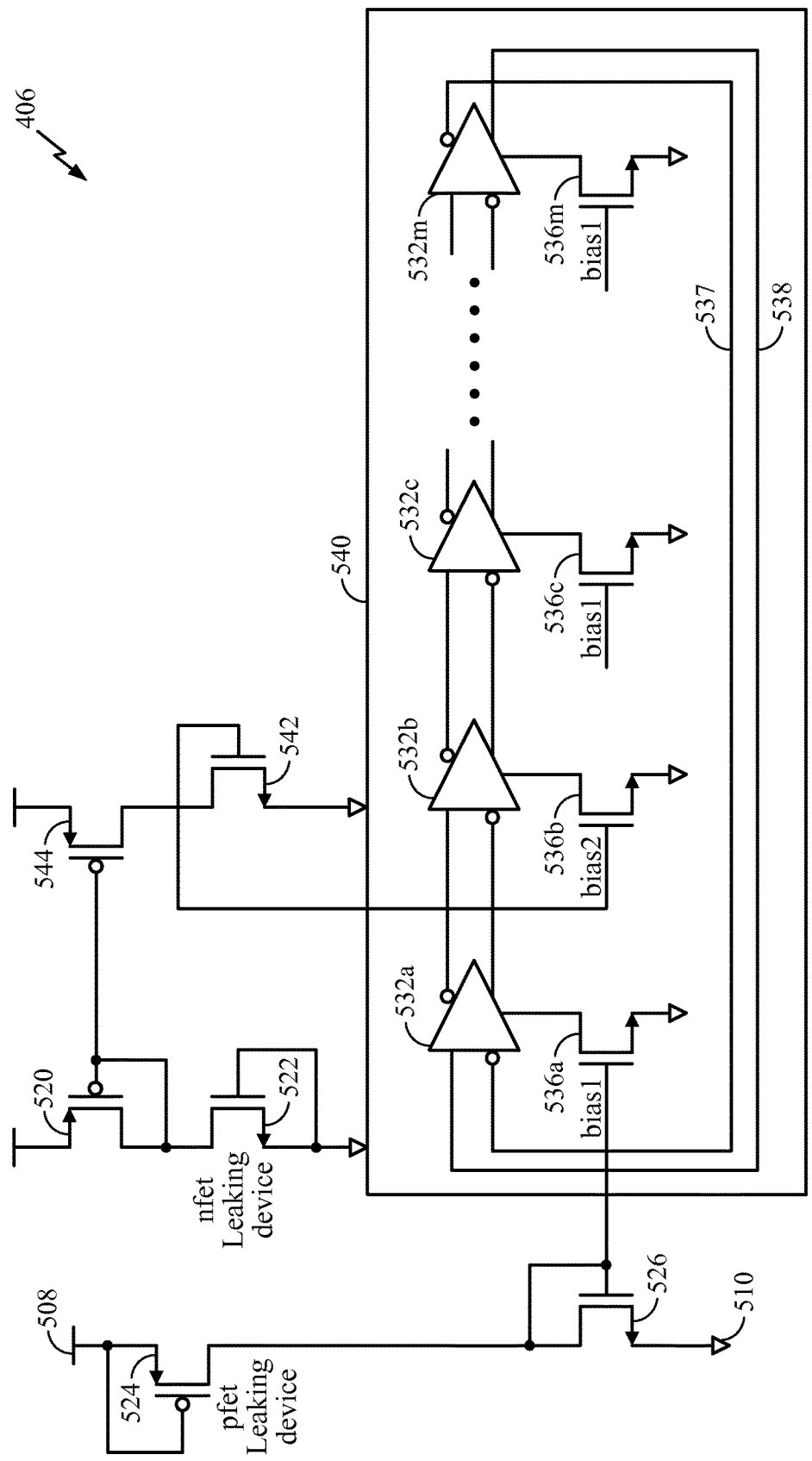
Figure 5E:
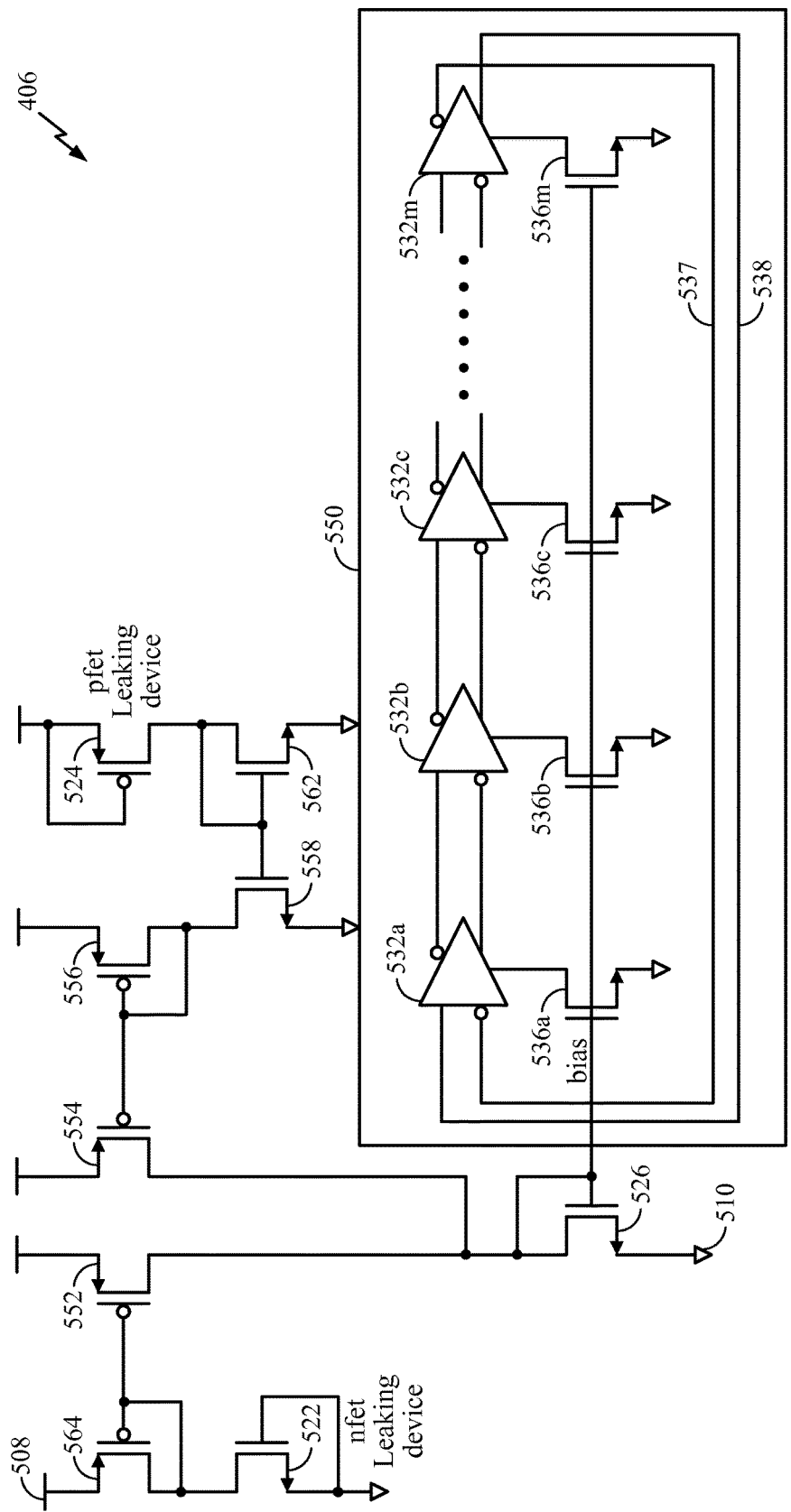
Figure 5F:
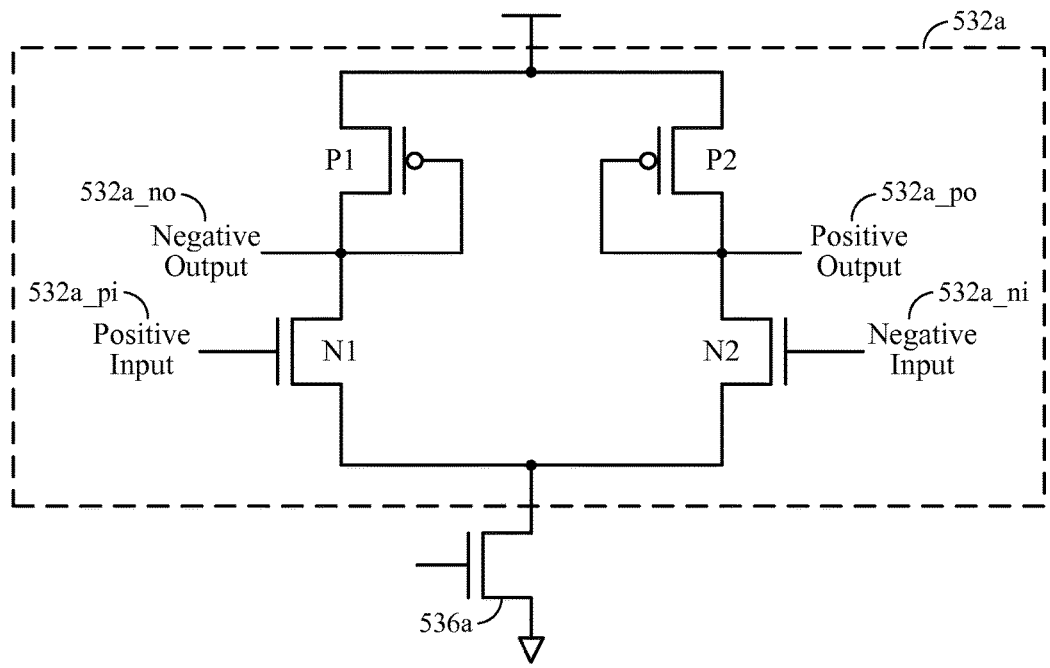
FIGS. 5F-G illustrate example implementations of differential inverters shown in FIGS. 5C-E.
Figure 5G:
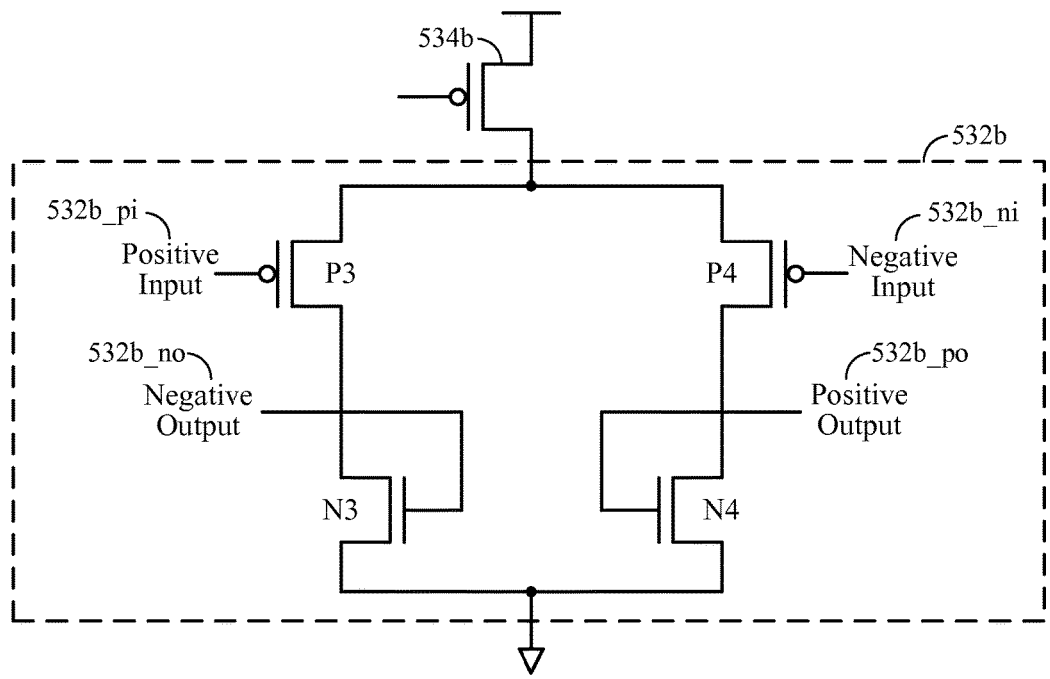

In the implementations of leakage current sensor 406 shown in FIGS. 5C-E, the inverters are differential inverters comprising positive and negative inputs and outputs. FIGS. 5F-G illustrate detailed implementations of example differential inverters which may be used in implementations of leakage current sensor 406 shown in FIGS. 5C-E. In order for the ring oscillator in the implementations of leakage current sensor 406 shown in FIGS. 5C-E to oscillate, each differential inverter is connected such that the outputs are inverted from their inputs. An advantage of the differential designs in these implementations is that the leakage current sensed is immune to power supply noise, which in turn means that the frequency of oscillation is only dependent on leakage current biasing and not on the power supply. Accordingly, calibration of leakage current sensor 406 is simplified. This simplifies the calibration phase.

For example, FIG. 5C, illustrates a third implementation of leakage current sensor 406, comprising ring oscillator 530. The three or more differential inverters 532a-m of ring oscillator 530 have one input negated and one output negated, with the non-negated output of differential inverter 532m connected through feedback path 538 to the negated input of differential inverter 532a and the negated output of differential inverter 532m connected through feedback path 537 to the non-negated input of differential inverter 532a. Differential inverters 532a-m can be configured in at least two ways, based for example, on whether they are coupled to positive supply voltage through a PFET such as PFET 534b or coupled to ground through an NFET such as NFET 536a. In the ring network of ring oscillator 530, differential inverters 532a-m may alternate between a first and second configuration. These two configurations of differential inverters will now be described with reference to FIGS. 5F-G.

FIG. 5F shows the first configuration of an exemplary differential inverter, which may correspond to differential inverter 532a. Differential inverter 532c which is also shown in FIG. 5C may be similarly configured in the first configuration like differential inverter 532a. Similarly, every other differential inverter may be configured in the first configuration. As shown in FIG. 5F, differential inverter 532a can include a first inverter formed by NFET N1 and PFET P1, and a second inverter formed by NFET N2 and PFET P2. PFETs P1 and P2 may be diode-coupled, with their gate terminals connected to their drain terminals. Negative output 532a_no may be derived at the drain terminal of PFET P1 and positive output 532a_po may be derived at the drain terminal of PFET P2. Positive input 532a_pi may be coupled to the gate terminal of NFET N1 and negative input 532a_ni may be coupled to the gate terminal of NFET N2. Thus, with combined reference now to FIGS. 5C and 5F, it is seen that feedback path 537 is coupled to positive input 532a_pi and feedback path 538 is coupled to negative input 532a_ni; while negative output 532a_no is coupled to wire 571 and positive output 532a_po is coupled to wire 573.

FIG. 5G shows the second configuration of another exemplary differential inverter, which may correspond to differential inverter 532b. Although other inverters of a similar configuration are not explicitly illustrated, every other differential inverter of differential inverters 532a-m may be similarly configured in the second configuration. As shown in FIG. 5G, differential inverter 532b can include a third inverter formed by NFET N3 and PFET P3, and a fourth inverter formed by NFET N4 and PFET P4. NFETs N3 and N4 may be diode-coupled, with their gate terminals connected to their drain terminals. Negative output 532b_no may be derived at the drain terminal of NFET N3 and positive output 532b_po may be derived at the drain terminal of NFET N4. Positive input 532b_pi may be coupled to the gate terminal of PFET P3 and negative input 532b_ni may be coupled to the gate terminal of PFET P4. Thus, with combined reference now to FIGS. 5C and 5G, it is seen that wire 571 is coupled to positive input 532b_pi and wire 573 is coupled to negative input 532b_ni; while negative output 532b_no is coupled to wire 575 and positive output 532b_po is coupled to wire 577.

With the above configurations of differential inverters 532a-m, it is seen in FIG. 5C, similar to FIG. 5B, that the first bias circuit comprising PFET 528 and NFET leaking device 522 is connected to PFETs such as PFETs 534b coupled to differential inverters of the second configuration, such as differential inverter 532b; while the second bias circuit comprising PFET leaking device 524 and NFET leaking device 522 is coupled to NFETs such as NFETs 536a, 536c coupled to differential inverters of the first configuration, such as differential inverters 532a, 532c. In ring oscillator 530, leakage current of PFETs 534b control the rise and fall of signals in differential inverters of the second configuration, whereas NFET leaking device 522 controls the rise and fall of signals of the differential inverters formed of the first configuration. Controls for the first and second configurations can also be reversed in an alternative implementation. The last stage of ring oscillator 530, comprising differential inverter 532*m* is shown to be connected to both PFET 534*m* and NFET 536*m* in order to demonstrate that either an NFET or a PFET differential pair can be used in the alternative implementation.

FIG. 5D shows a fourth implementation of leakage current sensor 406, comprising ring oscillator 540, which comprises the three or more differential inverters 532*a-m* of the type described with reference to ring oscillator 530 of FIG. 5C. In FIG. 5D, only NFETs 536*a-m* are shown for controlling leakage current passing through differential inverters 532*a-m*, configured in the first configuration shown in FIG. 5F. Alternate NFETs 536*a-m* can be biased with different bias voltages. For example, NFETs 536*a*, 536*c*, etc., are biased with a first bias voltage provided by a second bias circuit and NFET 536*b* and every other NFET not biased by the first bias voltage is biased with a second bias voltage provided by a second bias circuit. Currents for the first and second bias circuits are supplied by current mirrors comprising PFET 544 and NFET 542, as shown.

FIG. 5E shows a fifth implementation of leakage current sensor 406, comprising ring oscillator 550, which also comprises the three or more differential inverters 532*a-m* of the type described with reference to ring oscillators 530 and 540 of FIGS. 5C-D. In FIG. 5E, also, only NFETs 536*a-m* coupled to differential inverters 532*a-m*, all configured in the first configuration of FIG. 5F, to control the leakage current passing through differential inverters 532*a-m*. Bias circuit comprising PFETs 564, 552, 554, 556, and leaking device 524 and NFET leaking device 522, 558, 562, and 526 provide the bias voltage for NFETs 536*a-m*. More specifically, bias voltages for all NFETs 536*a-m* is the sum of the bias voltage supplied by NFET leaking device 522 and PFET leaking device 524. PFETs 564 and 552 constitute a first current mirror, to mirror NFET leaking device 522. NFETs 562 and 558 and PFETs 556 and 554 constitute a second current mirror, to mirror PFET leaking device 524. The sum of currents mirrored by the first and second current mirrors is obtained by coupling the drain of PFETs 554 and 552 to the drain of NFET 526. This sum is used to provide the aforementioned bias voltages for NFETs 536*a-m*.

Referring back to FIG. 4B, using any one of the above five implementations of leakage current sensor 406 shown in FIGS. 5A-E, or any other suitable alternative implementation, sensed leakage current (measured based on ring oscillator frequency) is supplied to ADC 408, as previously mentioned. ADC 408 supplies a digital code corresponding to the sensed leakage current. Based on the value of the digital code, the aforementioned state machine, FSM 410, may be used to determine a number of one or more PMOS transistors 412*a-p* to turn on in leakage current supply circuit 412.

Figure 7:
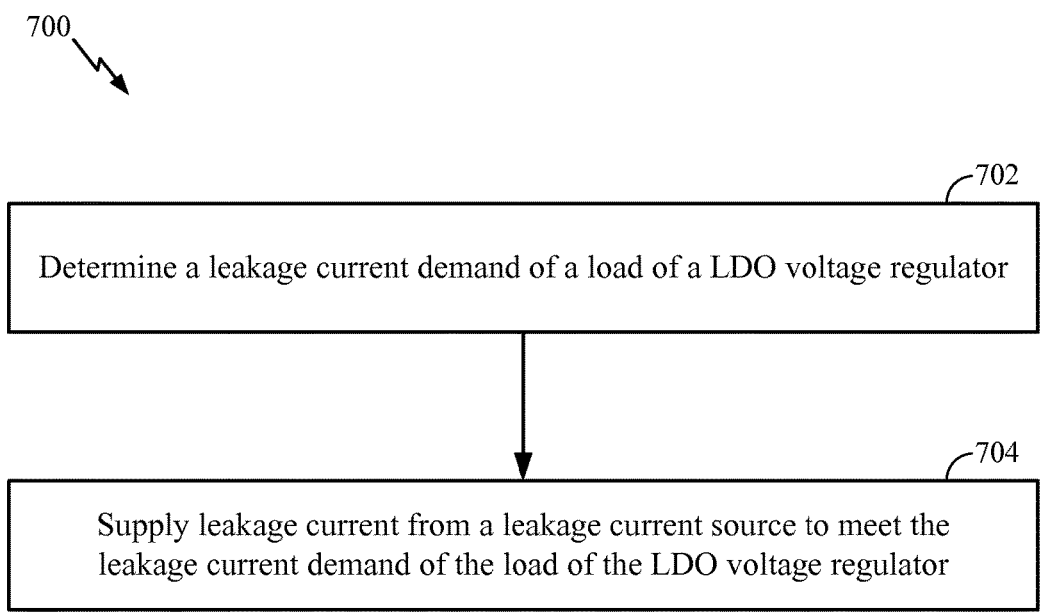
FIG. 7 illustrates a flow chart pertaining to a process of operating an LDO voltage regulator with current assistance provided by the exemplary leakage current supply source.

Accordingly, it will be appreciated that exemplary aspects include various methods for performing the processes, functions and/or algorithms disclosed herein. For example, FIG. 7 illustrates method 700 of operating a low-dropout voltage (LDO) voltage regulator. Method 700 can include the following aspects.

In Block 702, method 700 includes determining a leakage current demand of a load of the LDO voltage regulator. For example, using leakage current sensor 406, leakage current demand of load 432 of LDO voltage regulator 404 can be obtained (where, as will be recalled, LDO voltage regulator 404 may be configured to receive maximum supply voltage and provided a regulated voltage to load 432). Leakage current sensor 406 can be configured according to any of the example implementations shown and described with reference to FIGS. 5A-E.

In Block 704, method 700 comprises supplying leakage current from a leakage current supply source to meet the leakage current demand of the load of the LDO voltage regulator. For example, leakage current 403 from FIG. 4A can be supplied to load 432 from leakage current supply source 402. More specifically, FSM 410 can turn on an appropriate number of PMOS transistors 412*a-p* in leakage current supply circuit 412, based on the digital code supplied by ADC 408, which represents the amount of current sensed by leakage current sensor 406. In this manner, LDO voltage regulator 404 can be designed to supply only the dynamic or fast changing current to load 432, and thus, headroom voltage (i.e., the difference between the maximum supply voltage and the regulated voltage) of LDO voltage regulator 404 can be advantageously reduced, which in turn, can increase the number of DVFS states available for load 432.

Moreover, it will also be understood that one or more aspects of this disclosure pertain to a system (such as system 400, which can be a multi-core processing system or other integrated circuit) which includes means for regulating voltage of a load, wherein the means for regulating voltage of the load comprises means for receiving a maximum supply voltage and means for providing a regulated voltage to the load. For example, the means for regulating voltage of a load can be LDO voltage regulator 404 used for supplying regulated voltage to load 432 based on receiving maximum supply voltage or input voltage Vin 428 (which may be VDD 108 shown in FIG. 1, for example) and providing output voltage Vout 430, which is a regulated voltage that is lower than the input voltage Vin 428.

The system can further include means for determining a leakage current demand of the load, which can include means for sensing the leakage current demand of the load of the LDO voltage regulator based on temperature, voltage, and process corners related to the load. For example, the means for determining leakage current demand of the load can include leakage current sensor 406 which comprises ring oscillators (e.g., ring oscillators 500-550 shown in FIGS. 5A-E) for determining leakage current based on temperature, voltage, and process corners related to the load. Additionally, means for converting the sensed leakage current demand to a digital code, such as ADC 408, may be provided.

The system can further include means for supplying leakage current to meet the leakage current demand of the load, which can include, for example, means for determining a number of p-channel metal oxide semiconductor (PMOS) transistors to be switched on in order to supply the leakage current demand of the load. For example, means for supplying the leakage current can include leakage current supply circuit 412 comprising one or more PMOS transistors 412*a-p*, and FSM 410 may comprise means for determining the number of PMOS transistors 412*a-p* to be switched on in leakage current supply circuit 412 to meet the leakage current demand, based on the digital code received from ADC 408.

Figure 8:
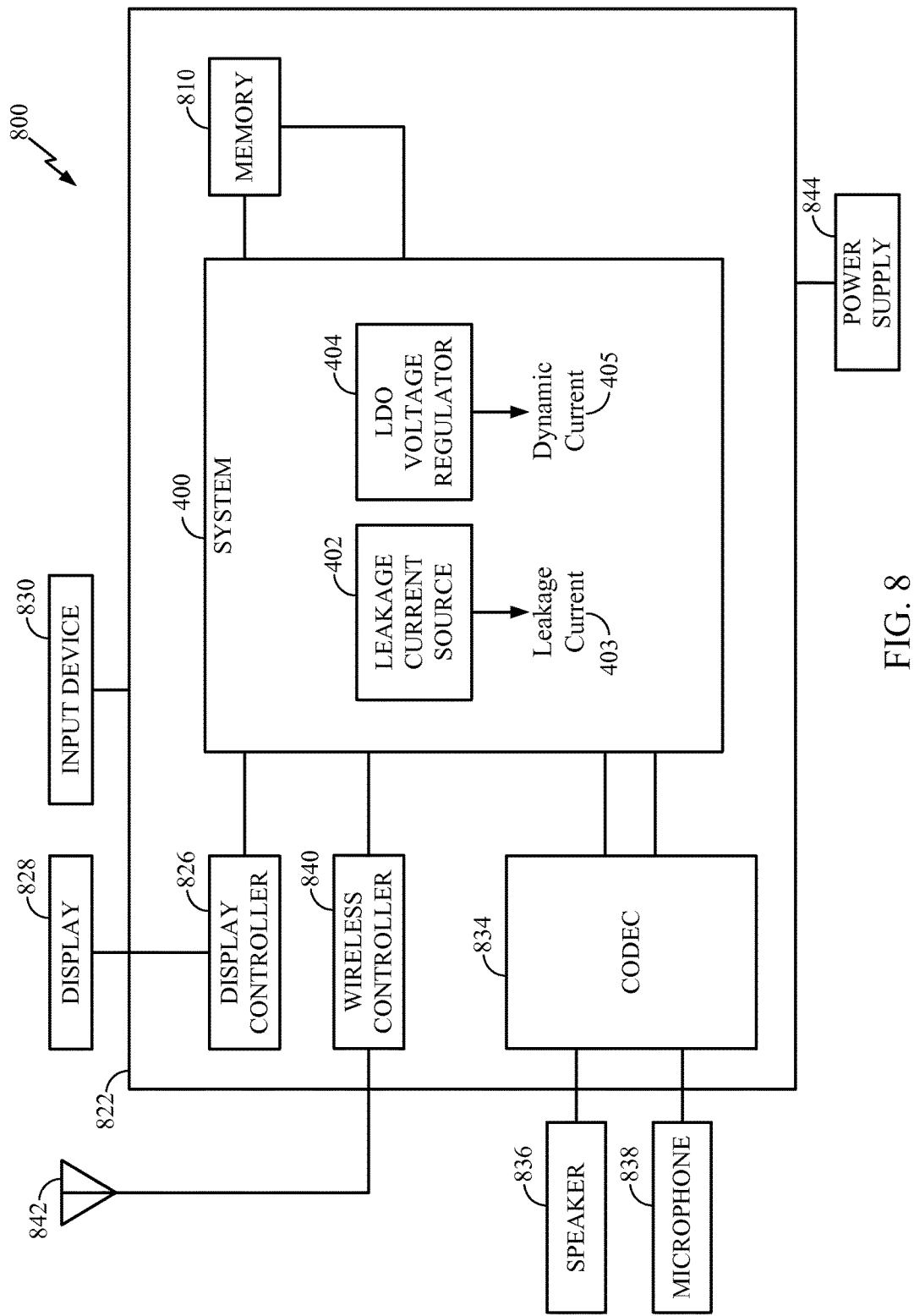
FIG. 8 illustrates an exemplary wireless device in which an aspect of the disclosure may be advantageously employed.

An example apparatus in which the exemplary leakage current supply source 402 may be deployed will now be discussed in relation to FIG. 8. FIG. 8 shows a block diagram of wireless device 800 that is configured according to exemplary aspects. Wireless device 800 includes system 400, which may be a processing system comprising one or more processing cores. In FIG. 8, leakage current supply source 402 is shown to supply leakage current 403 which provides current assistance to LDO voltage regulator 404 which supplies dynamic current 405 to a load, which may be a processing core or other subsystem of system 400. System 400 may be communicatively coupled to memory 810.

FIG. 8 also shows display controller 826 that is coupled to system 400 and to display 828. Coder/decoder (CODEC) 834 (e.g., an audio and/or voice CODEC) can be coupled to system 400. Other components, such as wireless controller 840 (which may include a modem) are also illustrated. Speaker 836 and microphone 838 can be coupled to CODEC 834. FIG. 8 also indicates that wireless controller 840 can be coupled to wireless antenna 842. In a particular aspect, system 400, display controller 826, memory 810, CODEC 834, and wireless controller 840 are included in a system-in-package or system-on-chip device 822.

In a particular aspect, input device 830 and power supply 844 are coupled to the system-on-chip device 822. Moreover, in a particular aspect, as illustrated in FIG. 8, display 828, input device 830, speaker 836, microphone 838, wireless antenna 842, and power supply 844 are external to the system-on-chip device 822. However, each of display 828, input device 830, speaker 836, microphone 838, wireless antenna 842, and power supply 844 can be coupled to a component of the system-on-chip device 822, such as an interface or a controller.

It should be noted that although FIG. 8 depicts a wireless communications device, system 400 and memory 810, may also be integrated into a set top box, music player, video player, entertainment unit, navigation device, communications device, personal digital assistant (PDA), fixed location data unit, mobile phone, computer, or other similar devices.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an aspect of the invention can include a computer readable media embodying a method for reducing headroom voltage of LDO voltage regulators. Accordingly, the invention is not limited to illustrated examples and any means for performing the functionality described herein are included in aspects of the invention.

While the foregoing disclosure shows illustrative aspects of the invention, it should be noted that various changes and modifications could be made herein without departing from the scope of the invention as defined by the appended claims. The functions, steps and/or actions of the method claims in accordance with the aspects of the invention described herein need not be performed in any particular order. Furthermore, although elements of the invention may be described or claimed in the singular, the plural is contemplated unless limitation to the singular is explicitly stated.

What is claimed is:

1. A method of operating a low-dropout voltage (LDO) voltage regulator, the method comprising:
    determining a leakage current demand of a load of the LDO voltage regulator; and
    supplying leakage current from a leakage current supply source to meet the leakage current demand of the load of the LDO voltage regulator.

2. The method of claim 1, comprising receiving a maximum supply voltage as an input of the LDO voltage regulator and providing an output voltage to the load of the LDO voltage regulator, wherein supplying the leakage current from a leakage current supply source comprises reducing a headroom voltage of the LDO voltage regulator, wherein the headroom voltage of the LDO voltage regulator is a difference between the maximum supply voltage and the output voltage provided to the load of the LDO voltage regulator.

3. The method of claim 1, wherein determining the leakage current demand of the load of the LDO voltage regulator comprises sensing leakage current of the load based on temperature, voltage, and process corners related to the load.

4. The method of claim 3, further comprising determining a frequency of a ring oscillator based on the sensed leakage current of the load.

5. The method of claim 1, further comprising converting the sensed leakage current to a digital code.

6. The method of claim 5, further comprising determining, from the digital code, a number of p-channel metal oxide semiconductor (PMOS) transistors to be switched on to supply the leakage current from the leakage current supply source.

7. The method of claim 6 comprising increasing the number of PMOS transistors to be switched on for higher values of the digital code and decreasing the number of PMOS transistors to be switched on for lower values of the digital code.

8. The method of claim 1, wherein the load of the LDO voltage regulator is a processing core of a multi-core processing system.

9. An apparatus comprising:
    a leakage current supply source comprising:
        a leakage current sensor configured to determine a leakage current demand of a load of a low-dropout voltage (LDO) voltage regulator; and a leakage current supply circuit configured to supply leakage current to meet the leakage current demand of the load of the LDO voltage regulator.

10. The apparatus of claim 9, wherein the low-dropout voltage (LDO) voltage regulator is configured to receive a maximum supply voltage and provide an output voltage to the load of the LDO voltage regulator.

11. The apparatus of claim 10, wherein the leakage current supply source is configured to reduce a headroom voltage of the LDO voltage regulator, wherein the headroom voltage of the LDO voltage regulator is a difference between the maximum supply voltage and the output voltage provided to the load of the LDO voltage regulator.

12. The apparatus of claim 9, wherein the leakage current sensor is configured to sense the leakage current demand of the load of the LDO voltage regulator based on temperature, voltage, and process corners related to the load.

13. The apparatus of claim 12, wherein the leakage current sensor comprises a ring oscillator, wherein a frequency of the ring oscillator is based on the sensed leakage current demand of the load.

14. The apparatus of claim 13, wherein the ring oscillator comprises an odd number of inverters connected in a ring.

15. The apparatus of claim 14, wherein the inverters are current-starved based on head switches, foot switches, or a combination thereof, configured to allow only leakage current to pass through.

16. The apparatus of claim 14, wherein the inverters are differential inverters.

17. The apparatus of claim 12, wherein the leakage current sensor comprises an analog to digital converter (ADC) configured to convert the sensed leakage current demand to a digital code.

18. The apparatus of claim 12, further comprising a finite state machine (FSM) configured to determine, from the digital code, a number of p-channel metal oxide semiconductor (PMOS) transistors to be switched on in order to supply the leakage current from the leakage current supply circuit.

19. The apparatus of claim 18 wherein the number of PMOS transistors to be switched on is higher for higher values of the digital code and the number of PMOS transistors to be switched on is lower for lower values of the digital code.

20. The apparatus of claim 9, wherein the load of the LDO voltage regulator is a processing core of a multi-core processing system.

21. The apparatus of claim 9, integrated in integrated into a device selected from the group consisting of a set top box, music player, video player, entertainment unit, navigation device, communications device, personal digital assistant (PDA), fixed location data unit, mobile phone, and a computer.

22. A system comprising:
means for determining a leakage current demand of a load of a means for regulating voltage; and
means for supplying leakage current to meet the leakage current demand of the load.

23. The system of claim 22, wherein the means for determining the leakage current demand of the load comprises means for sensing the leakage current demand of the load based on temperature, voltage, and process corners related to the load.

24. The system of claim 23, further comprising means for converting the sensed leakage current demand to a digital code.

25. The system of claim 24, further comprising means for determining, from the digital code, a number of p-channel metal oxide semiconductor (PMOS) transistors to be switched on in order to supply the leakage current demand of the load.

* * * * *